United States Patent [19]

Nakamura

[11] Patent Number: 5,712,505
[45] Date of Patent: Jan. 27, 1998

[54] BIPOLAR TRANSISTOR HAVING RING SHAPE BASE AND EMITTER REGIONS

[75] Inventor: Shunji Nakamura, Kawasaki, Japan

[73] Assignee: Fujitsu Limited, Kawasaki, Japan

[21] Appl. No.: 569,942

[22] Filed: Dec. 8, 1995

Related U.S. Application Data

[62] Division of Ser. No. 313,571, Sep. 27, 1994, Pat. No. 5,501,992, which is a division of Ser. No. 74,680, Jun. 10, 1993, abandoned.

[30] Foreign Application Priority Data

Jun. 11, 1992 [JP] Japan ...................... 4-151861

[51] Int. Cl.$^6$ .................... H01L 29/70; H01L 29/739
[52] U.S. Cl. .................... 257/565; 257/585; 257/587; 257/592; 257/593
[58] Field of Search ...................... 257/587–588, 257/591–593, 565, 585, 557–559; 437/162

[56] References Cited

U.S. PATENT DOCUMENTS

| | | | |
|---|---|---|---|
| 5,070,030 | 12/1991 | Ikeda et al. | 437/31 |
| 5,204,277 | 4/1993 | Somero et al. | 437/162 |
| 5,258,642 | 11/1993 | Nakamura | 257/514 |
| 5,389,552 | 2/1995 | Iranmanesh | 148/DIG. 11 |
| 5,409,845 | 4/1995 | Robinson et al. | 437/31 |

FOREIGN PATENT DOCUMENTS

| | | |
|---|---|---|
| 0435308 | 7/1991 | European Pat. Off. . |
| 0015977 | 1/1989 | Japan . |
| 0175219 | 7/1993 | Japan . |

OTHER PUBLICATIONS

S. Nakamura et al., Bipolar Technology for a 0.5–Micron–Wide Base Transistor With an ECL Gate Delay of 21.5 Picoseconds, International Electron Devices Meeting 1992, IEEE, pp. 445–448.

*Primary Examiner*—Peter Toby Brown
*Attorney, Agent, or Firm*—Staas & Halsey

[57] ABSTRACT

A ring-shaped emitter region is formed either in a region a little toward an inner periphery or in a region a little toward an outer periphery in an upper layer portion of a ring-shaped base region of a bipolar transistor.

A conductive layer is laminated through an insulating layer in a region surrounded by the ring-shaped emitter region provided a little toward the inner periphery of the base region, a conductive side wall is formed on the sides of the conductive layer and the insulating layer, and the ring-shaped emitter region and the conductive layer are connected through the conductive side wall. A metallic emitter electrode is connected to the conductive layer.

On the other hand, in a region surrounded by the ring-shaped base region in which the ring-shaped emitter region is formed a little toward the outer periphery, a conductive layer is laminated through an insulating layer, a conductive side wall is formed on the sides of the conductive layer and the insulating layer, and the ring-shaped base region and the conductive layer are connected through the conductive side wall. A metallic base electrode is connected to the conductive layer.

Since an emitter region and a collector region have the same conduction type in a bipolar transistor, such a bipolar transistor that has a construction in which the emitter described above is used as a collector is also available.

3 Claims, 11 Drawing Sheets

5,712,505

BIPOLAR TRANSISTOR HAVING RING SHAPE BASE AND EMITTER REGIONS

CROSS REFERENCE TO RELATED APPLICATIONS

This application is a division of application Ser. No. 08/313,571, filed Sep. 27, 1994, now U.S. Pat. No. 5,501,992, which in turn is a division of application Ser. No. 08/074,680, filed Jun. 10, 1993, now abandoned.

BACKGROUND OF THE INVENTION

1. Field of the Invention

The present invention relates to a self-alignment type bipolar transistor which is built in a semiconductor integrated circuit device and a method of manufacturing the same.

2. Description of the Related Art

With the recent growth of an information-oriented society, development of a computer capable of processing a large amount of information at a higher speed is being demanded.

In order to develop such a computer, it is necessary to achieve a high speed in a semiconductor integrated circuit device which is one of important components in point of the function of a computer, and it is further required for that purpose to achieve a high speed of transistors forming the semiconductor integrated circuit.

FIG. 1 is a structural explanatory view of a conventional self-alignment type bipolar transistor.

In FIG. 1, a reference numeral 1 represents an n-type silicon epitaxial layer, 2 represents a LOCOS oxide film, 3 represents a silicon oxide layer, 4 represents a boron-doped polysilicon layer, 5 represents a silicon oxide layer, 6 represents an opening, 7 represents a p-type base region, 8 represents a boron-doped polysilicon side wall, 9 represents a silicon oxide side wall, 10 represents a polysilicon layer, 11 represents an n-type emitter region, 12 represents an opening for a base electrode, 13 represents an emitter electrode and 14 represents a base electrode.

An example of a structure of a conventional self-alignment type bipolar transistor as well as a manufacturing process thereof will be described based on this figure.

First, as a first process, an n$^+$type buried layer 16 for reducing series resistance of a collector on a silicon substrate 15 is formed, and an n$^-$type silicon epitaxial layer 1 having a thickness of approximately 1 µm is formed thereafter.

As a second process, a silicon nitride (Si$_3$N$_4$) layer not illustrated is formed in an element forming region on the n$^-$type silicon epitaxial layer 1, and the n$^-$type silicon epitaxial layer 1 is oxidized thermally with the silicon nitride layer as a mask, thereby to form the LOCOS oxide film (SiO$_2$) 2.

Further, n-type impurities are diffused from a collector contact portion where the LOCOS oxide film 2 is not formed, thereby to form an n$^+$type diffused region 17 in the depth of reaching the n$^+$type buried layer 16 described above. This n$^+$type diffused region 17 serves as a current passage of a contact layer.

As a third process, the silicon oxide layer 3 having a thickness of approximately 2,000 Å is formed on the whole surface by a CVD method and the boron (B) doped polysilicon layer 4 having a thickness of 3,000 Å is formed thereon, and thereafter, unnecessary portions except those for pulling out an electrode from the base region are removed by patterning.

Then, the silicon oxide layer 5 having a thickness of approximately 3,000 to 4,000 Å is formed on the whole surface by a CVD method.

As a fourth process, the opening 6 penetrating through the silicon oxide layer 5, the boron-doped polysilicon layer 4 and the silicon oxide layer 3 is formed on the base region by a photolithography technique.

As a fifth process, after a thin boron-doped polysilicon layer is formed on the whole surface by a CVD method, resist is applied thereon, and the resist is etched back to be left so as to be buried in a recessed portion of the thin boron-doped polysilicon layer formed along the inner periphery of the opening 6. Thereafter, the exposed portion of this thin boron-doped polysilicon layer is removed by anisotropic etching with the buried resist as a mask, and over-etching of about 2000 to 3000 Å is performed further. Furthermore, the resist inside the opening 6 is removed and the boron-doped polysilicon layer remaining in the opening 6 is etched by RIE, thereby to form the side wall 8 composed of boron-doped polysilicon which is lower than the upper edge of the opening 6, and also to expose a part of the n$^-$type silicon epitaxial layer 1 from the opening 6.

Next, as a sixth process, ions of p-type impurities are implanted into the n$^-$type silicon epitaxial layer 1 through the opening 6 so as to form the inside of the base region 7, and on the other hand, boron impurities of the doped polysilicon layer 4 are diffused into the n$^-$type silicon epitaxial layer 1 by heat treatment through the side wall 8, thereby to form the outside of the base region 7.

As a seventh process, a thick silicon oxide layer is formed on the whole surface by a CVD method and the silicon oxide side wall 9 is formed by anisotropic etching such as RIE, and an opening 6$a$ is also formed for exposing the base region 7 at a portion surrounded by the side wall 9.

The polysilicon layer 10 is formed by a CVD method along the side wall 9 of the silicon oxide in the opening 6 and the surface of the base region 7. As ions are implanted into this polysilicon layer 10 and heat treatment is applied thereto, thereby to form the n-type emitter region 11 in the upper layer portion of the base region 7.

Since the conductive side wall 8 composed of boron-doped polysilicon has been formed lower than the upper edge of the opening 6 previously, the insulating side wall 9 composed of silicon oxide is formed covering the conductive side wall 8 in a sufficient thickness. Thus, the conductive side wall 8 and the polysilicon layer 10 will never be short-circuited with each other.

As an eighth process, the opening 12 for a base electrode is formed in the silicon oxide layer 5 in the vicinity of the opening 6, and an opening 18 for collector contact is formed further. Thereafter, an Al film is formed on the whole surface, and the emitter electrode 13, the base electrode 14 and a collector electrode 19 are formed by applying patterning thereto.

The technique of such a bipolar transistor is described in a document of International Electron Devices Meeting 1992 p.445–p.448 for instance.

In a bipolar transistor improved as described above, a remarkable high speed is attainable as compared with a bipolar transistor in existence before then.

However, the demands of the times for a high speed is very strong, and realization of a bipolar transistor further made higher in speed is looked forward to. In order to make a bipolar transistor further higher in speed, it is required to give consideration to the following points.

In order to realize a high speed of a bipolar transistor, it is required to reduce a base region and an emitter region, to decrease pn junction parasitic capacities being parasitic between the base region and the collector region and between the base region and the emitter region, respectively, and to decrease parasitic resistances being parasitic in the base region and the emitter region. By decreasing these parasitic capacities and parasitic resistances, shortening of lag time due to charge and discharge of parasitic capacities can be aimed at, thus making it possible to achieve a high speed of the operation.

In the above-described bipolar transistor, however, such problems as described in following articles (1) to (3) are generated when it is intended to simply reduce the base region 7 and the emitter region 11.

(1) In order to form a fine opening in a silicon oxide layer, a polysilicon layer or the like on the base region and the emitter region, it is required to develop a photoresist material having high resolution and exposure techniques of high accuracy of the next generation.

(2) The finer the opening for the emitter region becomes, the more difficult it becomes to form the opening stably.

The size of the opening 6a on the emitter region 11 is obtained by subtracting two times of the thickness in the width direction of the side wall 8 composed of polysilicon and two times of the thickness in the width direction of the insulating side wall 9 from the size of the opening 6 above the base region 7 formed at the beginning by exposure techniques.

As a result, the size of the opening 6a above the emitter region 11 becomes non-uniform due to dispersion of film thickness of the opening 6, the polysilicon side wall 8 and the insulating side wall 9 therearound.

In particular, in case the width of the opening 6a above the emitter region 11 was defined by the polysilicon side wall 8 and the insulating side wall 9 which are buried therein, it is liable to be affected by dispersion of the widths of the opening 6, the polysilicon side wall 8 and the insulating side wall 9. Therefore, a problem that the opening 6a above the emitter region is not opened also occurs in the worst case. Therefore, the smaller the opening 6a above the emitter region 11 becomes, the more difficult it becomes to show the opening 6a always stably.

(3) Even if the opening 6a for the emitter region is formed with high accuracy, various problems described hereunder are generated when the opening 6a becomes extremely small.

Sectional views for explaining the problems of a conventional very small opening 6a for an emitter region are shown in FIG. 2(A) and FIG. 2(B). In these figures, reference numerals same as those in FIG. 1 show the same parts as in FIG. 1 except that configurations and sizes are different.

First, as shown in FIG. 2(B), the silicon oxide layer 2, the boron-doped polysilicon layer 4 and the silicon oxide layer 5 are deposited on the n-type silicon epitaxial layer 1, and an opening 6 having a small diameter which penetrates through these three layers from the top is formed. When a base region 7 is formed by introducing impurities through the opening 6 and a boron-doped polysilicon side wall 8 and a side wall 9 composed of silicon oxide are formed in the opening 6 thereafter, a finer opening 6a for an emitter region in a size b obtained by subtracting two times of the widths of the side wall 8 composed of boron-doped polysilicon and the side wall 9 composed of silicon oxide from the width b of the opening 6.

Normally, in a bipolar transistor, a thin polysilicon layer is inserted inbetween an emitter diffused layer and an emitter metal electrode. The reason for the above is for preventing erosion of a reactant by eutectic alloy reaction between the emitter diffused layer and the emitter metal electrode into the diffused region.

In the formation of polysilicon by a CVD method performed normally, however, since entry of polysilicon into openings is excellent, the inside of the emitter opening 6a is buried completely by a polysilicon layer 10 as shown in FIG. 2(A) when the emitter width is narrowed. Then, impurities are introduced through the polysilicon layer 10 so as to form an emitter region 11 and to further form an emitter electrode 13 thereon.

However, the specific resistance of doped polysilicon is larger than that of a metal, and the doped polysilicon layer 10 formed in the fine opening 6a for an emitter region becomes slender as shown in FIG. 2(A). Therefore, the resistance from the emitter region 11 to the emitter electrode 13 becomes large, thus being unable to realize a high-speed bipolar transistor.

So, as shown in FIG. 2(B), the polysilicon layer 10 is not buried completely in the emitter opening 6a, but is formed very thin so as to have an almost equal thickness along the inner periphery of the opening 6a. Furthermore, it is sufficient that a low-resistance metal such as Al is deposited or sputtered in the opening 6a thereby to form an emitter electrode 13.

However, in this case, since entry of the metal into the opening 6a above the narrow emitter region 11 is poor, the metal does not fill the inside of the opening 6a, but is accumulated on the peripheral portion thereof. Thus, the very thin doped polysilicon layer 10 acts as an emitter electrode from the emitter diffused layer 11 up to the top of the opening 6a. Hence, the resistance becomes substantially high.

In order to suppress the resistance from the emitter region to the emitter electrode not to become high, the smallest width portion of the opening has to be approximately 0.8 µm, and the width of the emitter region formed below the opening becomes approximately 0.2 µm. In a bipolar transistor in this size, however, the parasitic capacity as described above cannot be reduced.

SUMMARY OF THE INVENTION

It is an object of the present invention to provide a semiconductor device provided with a bipolar transistor in which a very small base region and an emitter region exceeding the present photolithography techniques are formed and an emitter resistance is not increased even when the emitter region is formed fine and a method of manufacturing the same.

It is another object of the present invention to provide a bipolar transistor in which an inversion layer on a base region of a bipolar transistor is prevented from generating thereby to prevent a leak current between an emitter region and a collector region located on both sides thereof and a method of manufacturing the same.

It is still another object of the present invention to provide a bipolar transistor in which a current crowding effect is made difficult to be generated so as to further make high-speed operation possible and a method of manufacturing the same.

In a bipolar transistor according to the present invention, a ring-shaped emitter region is formed in a region located at a little to the inner periphery in a ring-shaped base region formed in a semiconductor layer which becomes a collector.

When the emitter region is formed a little to the inner periphery, a conductive layer is formed on the base region and the semiconductor layer surrounded by the ring-shaped emitter region, and the emitter region and the conductive layer are connected to each other by a conductive layer and a conductive side wall connected to a side wall of the insulating layer. This emitter region is formed by diffusing impurities contained in the conductive layer into the base region through the conductive side wall.

According to the foregoing, a metallic emitter electrode is connected onto a conductive layer arranged in a region surrounded by the emitter region. Thus, the distance from the emitter region to the metallic emitter electrode is reduced. Further, since the height of the conductive side wall connected to the emitter region becomes low by making the insulating layer formed in the region surrounded by the emitter region thinner, the emitter resistance will never be increased.

Further, a field plate is formed on the base region located between the emitter region and the collector region through an insulating layer so as to prevent inversion on the surface of the base region from occurring. This field plate is constructed of a conductive layer formed on the base region surrounded by the ring-shaped emitter region through an insulating layer.

Furthermore, since the emitter region is formed in a ring shape, the peripheral length is longer as compared with a simple rectangle, the maximum allowable current is increased when the current crowding effect is generated, and the maximum cutoff frequency is also increased. Thus, the transistor operation is made still higher in speed.

Moreover, in a bipolar transistor according to the present invention, the ring-shaped emitter region is formed in a region a little to the outer periphery in the ring-shaped base region formed in the semiconductor layer which becomes a collector. This emitter region is optimum in case the emitter electrode is pulled out from the outer side than the base electrode. In this case, a conductive layer is formed on the semiconductor layer surrounded by the ring-shaped base region through an insulating layer, a conductive side wall is formed on the side walls of the conductive layer and the insulating layer, the base region and the conductive layer are connected to each other by this conductive side wall, and the base electrode is connected onto the conductive layer. According to this construction, the resistance of the base electrode is not increased when the base electrode is pulled out of the center of the element.

Also, in case the ring-shaped emitter region is formed in a region a little to the outer periphery in the base region, the inversion layer in the base region between the emitter region and the collector region is not generated, thus preventing a leak current between collector and emitter from generating when the field plate is formed on the base region. Moreover, since the peripheral length of the ring-shaped emitter region becomes longer, the current crowding effect becomes difficult to be generated.

Since the emitter region and the collector region have the same conductive type in the bipolar transistor, the same is applied even when it is constructed so that the emitter region described above is used as the collector region and the collector region is applied as the emitter region.

Figure 1:
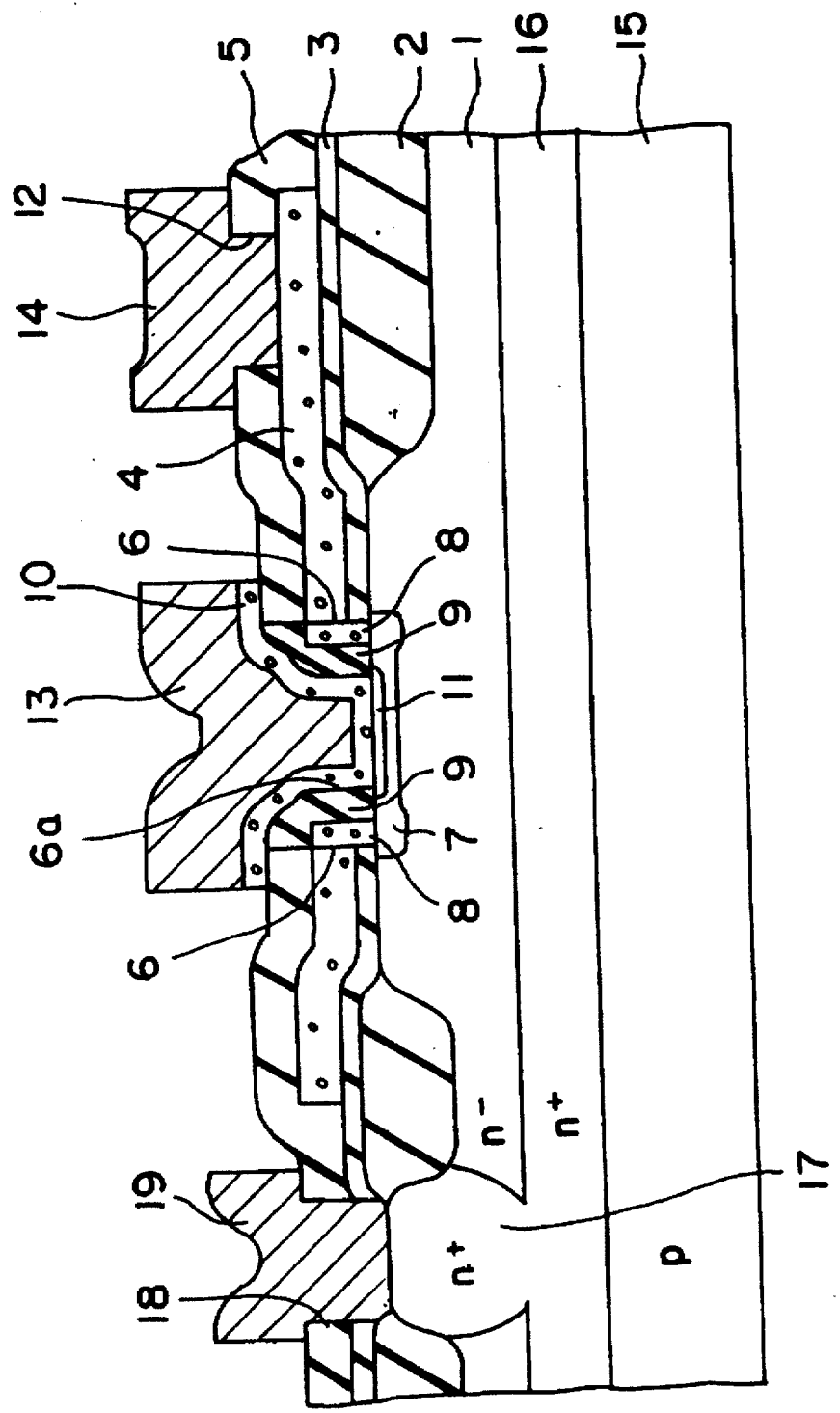
FIG. 1 is a sectional view showing a structure of a self-alignment type bipolar transistor according to a prior art.
Figure 2A:
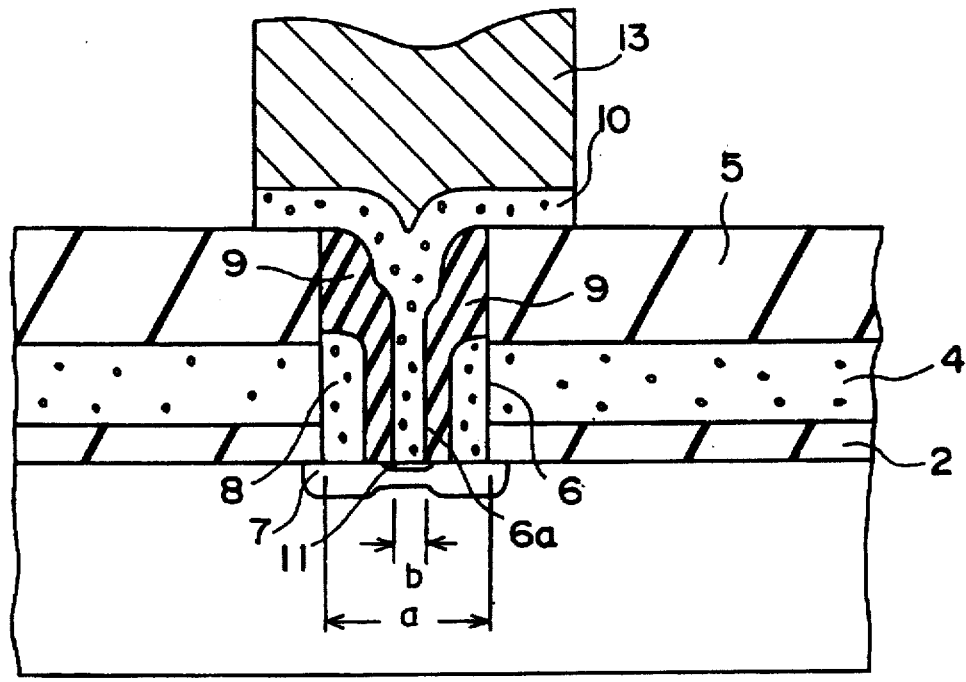
FIG. 2(A) and FIG. 2(B) are sectional views for explaining the problem of an opening above a very small emitter region of a bipolar transistor according to a prior art.
Figure 2B:
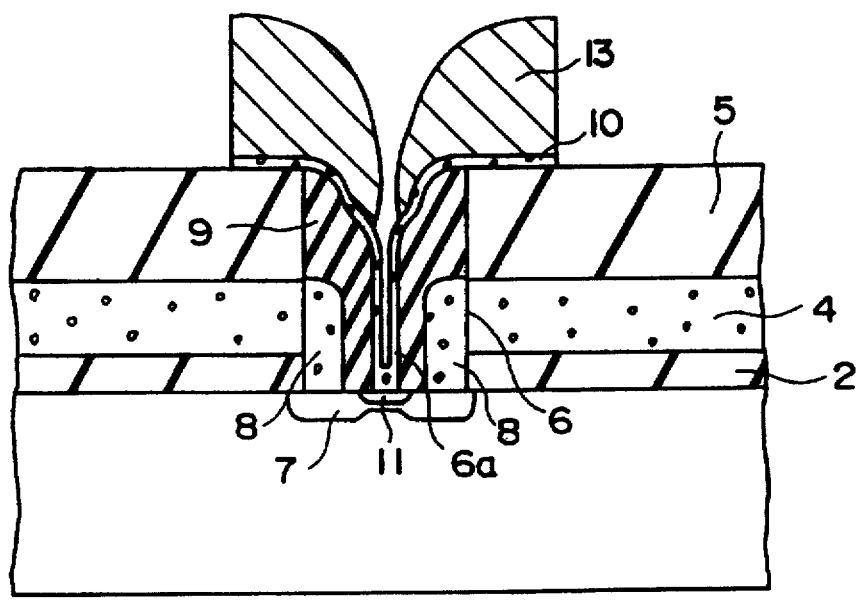

DETAILED DESCRIPTION OF THE PREFERRED EMBODIMENTS (1) First embodiment

FIG. 3(A) is a sectional view of a bipolar transistor according to a first embodiment of the present invention, and FIG. 3(B) is a plan view showing a part thereof.

The structure of the bipolar transistor of the first embodiment will be described hereunder.

An n⁻type silicon layer 23 is grown epitaxially on a semiconductor substrate 21 composed of p-type silicon through an n⁺type buried layer 22, and a LOCOS oxide film 24 composed of $SiO_2$ having a thickness of approximately 6,000 Å surrounding an element forming region is formed on the top of the silicon layer 23. A first $SiO_2$ layer 25 having a thickness of approximately 2,000 Å, a first polysilicon layer 26 doped with boron having a thickness of approximately 2,500 Å, and a second $SiO_2$ layer 27 having a thickness of approximately 5,000 Å are formed in sequence on the LOCOS oxide film 24 and the silicon layer 23. At a position a little to the center of the element forming region, a first opening 29 penetrating through the second $SiO_2$ layer 27, the first polysilicon layer 26 and the first $SiO_2$ layer 25 is formed.

A doughnut-shaped opening 30 leaving the first polysilicon layer 26 and the first $SiO_2$ layer 25 in an island form and exposing the surface of the silicon layer 23 from the periphery thereof is formed inside the first opening 29. No problem is encountered in particular even when the width of the doughnut-shaped opening 30, i.e., spacing between the peripheral surface of the first opening 29 and the side surface of a film left in an island form therein is made as short as 0.1 μm to 0.2 μm.

An outer peripheral side wall 31A composed of a second polysilicon layer is formed on an outer periphery of the doughnut-shaped opening 30, and an inner peripheral side wall 31B composed of the same polysilicon layer is formed on the inner periphery thereof. Further, a doughnut-shaped base region 32 is formed in an upper layer of the silicon layer 23 by p-type impurities introduced into the silicon layer 23 through the doughnut-shaped opening 30. Furthermore, an n-type doughnut-shaped emitter region 33 is formed in a part contacting the inner peripheral side wall 31B in the base region 32. Here, the n‾type silicon layer 23 under the base region 32 becomes a collector region.

Besides, the widths of respective side walls 31A and 31B are approximately 50 to 1000 Å.

Presumably, it is not necessary to form a laminated body existing in a region surrounded by the doughnut-shaped opening by patterning the first boron-doped polysilicon layer 26 and the first SiO$_2$ layer 25, but it may be formed by such other method that, after the first opening 29 is formed, an insulating film and a conductive film are laminated at the central region thereof.

Inside the doughnut-shaped opening 30, an insulating side wall 34 composed of SiO$_2$ is formed and connected to the island-shaped polysilicon layer 26 through a third opening 35 located at the center of the side wall 34, and an emitter electrode 36 conducting to the inner peripheral side wall 31B and the emitter region 33 is formed. Further, an opening 37 is formed in a second SiO$_2$ layer 27 located in a region near by the doughnut-shaped opening 30, and a base electrode connecting to the first polysilicon layer 26 through the opening 37 is formed.

This base electrode 38 is connected to the doughnut-shaped base region 32 through the first polysilicon layer 26 and the outer peripheral side wall 31A.

Further, an n$^+$type diffused region 39 is formed by introduction of impurities in the n‾type silicon layer 23 of the collector contact region surrounded by the LOCOS oxide film 24, and a collector electrode 40 is formed thereon.

The word "doughnut-shaped" among the doughnut-shaped opening 30, the doughnut-shaped base region 32 and the doughnut-shaped emitter region 33 does not necessarily mean that the planar configuration is a round form, but is to show a concept including a closed loop form which is almost a rectangular form or a square form in many cases, i.e., "a ring-shape".

Besides, the process of forming this bipolar transistor will be described later as a fourth embodiment.

According to the bipolar transistor of the present embodiment, operational effects are obtainable as follows.

1. The electrode is pulled out electrically of a doughnut-shaped emitter region by a conductor side wall having a small sectional area, but increase of the emitter resistance due to reduction of the emitter region can be suppressed since the distance can be shortened down to about the thickness of the first SiO$_2$ layer.

2. Since a field plate having a potential to prevent inversion of the base is formed on the base region through an insulating film, it is possible to prevent a leak current between the emitter region and the collector region from generating. The details thereof will be described with reference to FIG. 4(A) and FIG. 4(B).

Figure 4A:
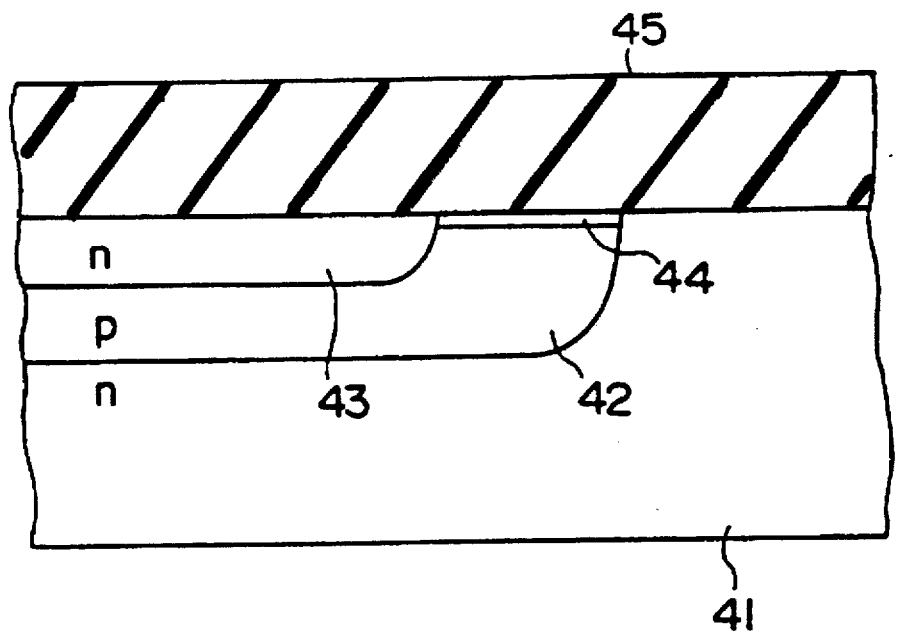
FIG. 4(A) is a sectional view for explaining parasitic MOS effect produced between an emitter region and a collector region of a bipolar transistor.
Figure 4B:
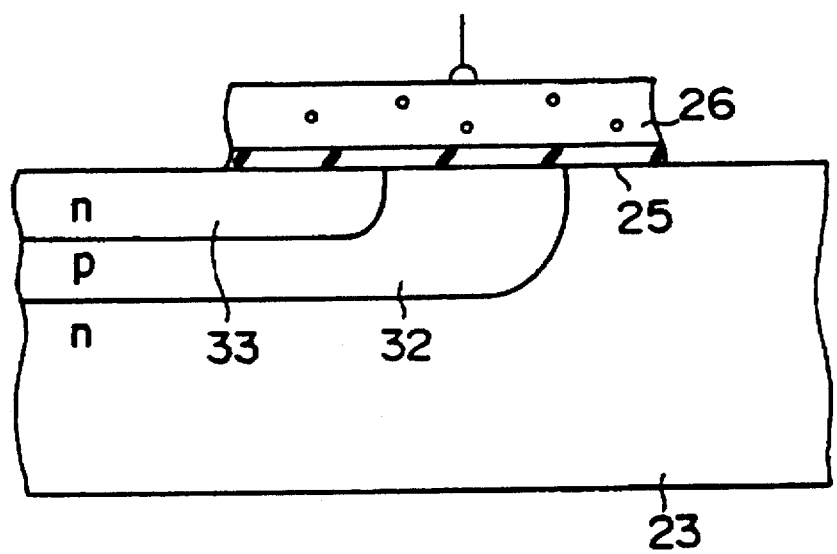
FIG. 4(B) is a sectional view showing a field plate between an emitter region and a collector region in the bipolar transistor of the first embodiment.

FIG. 4(A) and FIG. 4(B) are explanatory views for explaining a parasitic MOS effect between the emitter region and the collector region.

FIG. 4(A) shows a structure of surfaces of an emitter region, a base region and a collector region of a conventional bipolar transistor. In FIG. 4(A), 41 represents an n-type collector region, 42 represents a p-type base region, 43 represents an n-type emitter region, 44 represents an n-type inversion region, and 45 represent an insulating film.

In this construction, a thick insulating film 45 is formed on the surface where the emitter region 43, the base region 42 and the collector region 41 are adjacent thereto on the side having no base pulling-out electrode in a bipolar transistor. When a trap of electric charges is produced in the insulating film 45, however, an n-type inversion region 44 is produced on the surface of the base region 42 and a leak current has been generated sometimes between the emitter region 43 and the collector region 41 due to parasitic MOS effects.

FIG. 4(B) shows the construction of surfaces of an emitter region 33, a base region 32 and a collector region 23 of a bipolar transistor of the present invention.

In this construction, a portion where an island-shaped polysilicon layer 26 is formed on the surface where the emitter region 33, the base region 32 and the collector region are adjacent thereto on the side having no base pulling-out electrode in FIG. 3(A) through a thin insulating film 25, and the polysilicon layer 26 serves as a field plate.

Further, it is possible to prevent an n-type inversion area in the surface layer of the base region 32 which has been an issue in a conventional bipolar transistor from generating by applying a negative potential than that of the base region 32 to the field plate 26. Since the emitter is normally connected to a negative voltage side than the base when a transistor is incorporated into an ECL circuit, the object is achieved by connecting the field plate to the emitter.

Further, it is possible to prevent a p-type inversion region from generating in a similar manner even in case a base region turns into an n-type in a pnp transistor in lieu of the above-mentioned npn transistor.

3. Since the width of the emitter region 33 can be made relatively small, it is possible to virtually disregard the current crowding effect, thus using the emitter region 33 effectively. Moreover, since the base region 32 and the emitter region 33 are installed so as to form a doughnut shape, it is possible to lengthen the emitter region 33 approximately twice as long, and to increase the maximum allowable current even if the current crowding effect is generated.

In a conventional bipolar transistor, when the width of the emitter region is wider with respect to the width (width in the horizontal direction) of the base region, the current between the emitter region and the collector region flows only in the peripheral portion of the emitter region due to the current crowding effect and almost no current flows at the central portion, thus taking no part in the function of the transistor. Moreover, since the capacity between the collector region and the emitter region acts as a parasitic capacity, an operation of reducing the operating speed of the transistor has been produced.

In a bipolar transistor of the present invention, since the width of the emitter region becomes narrower relatively to the width of the base region, the current flows in the whole emitter region and the current crowding effect becomes harder to be produced. Thus, the whole emitter region is used effectively.

Further, according to the present invention, since the base region 32 and the emitter region 33 are arranged in a doughnut shape, the peripheral length of the emitter region 33 is lengthened approximately twice as long by the total length of the outer edge and the inner edge of the doughnut shape as compared with a case of simple rectangle, and the maximum allowable current is increased even if the current crowding effect is generated. With this, the highest cutoff frequency is increased, and the operating speed of the bipolar transistor is increased.

In order to have a bipolar integrated circuit operate at a high speed, it is normally required to reduce the charge and discharge time of the parasitic capacity such as a wiring capacity, and it is also required to apply a large current in order to charge these parasitic capacities rapidly.

However, since the current density when the transistor is operated at the highest speed is determined by Kirk effects depending on the construction of that transistor, only a method of lengthening the length of the emitter region while maintaining the current density constant is left to be done in order to increase the current quantity.

When the length of the emitter region is extended simply in a conventional bipolar transistor, such a result of enlarging areas of the base region and the collector region is produced. Therefore, such a contradiction is confronted that even capacities between the base region and the emitter region and between the base region and the collector region are increased, resulting in reduction of the operation speed of the transistor.

According to the present invention, since the base region and the emitter region are arranged in a doughnut shape, it is possible to make the effective length of the emitter region longer without increasing the areas of the base region and collector region, thus applying a large current without increasing the capacity between the base region and the collector region and shortening the charge and discharge time of the capacity such as the wiring capacity.

Further, a base region 23A of low concentration may be formed in the semiconductor layer 23 surrounded by the doughnut-shaped base region 32 by turning the n⁻type silicon layer 23 under the first SiO₂ layer 25 immediately under the opening 35 into p-type of low concentration by means of ion implantation. By doing so, it is possible to prevent leakage between the base and the emitter without generating parasitic MOS, and moreover, a high speed of the operation can be attained without increasing the parasitic capacity because of low concentration.

In the above-mentioned example, the outer peripheral side wall 31A and the inner peripheral side wall 31B composed of the second polysilicon layer are formed in the doughnut-shaped opening 30, but it is not necessarily required that these both side walls are separated independently in point of the film structure.

Namely, both side walls 31A and 31B are made not to be separated by adopting a method of depositing a silicon layer containing p-type impurities using what is called an epitaxial polysilicon growth technique in which, after forming the doughnut-shaped region 32 by introducing p-type impurities into the n⁻type silicon layer 23 exposed at the bottom of the doughnut-shaped opening 30, a single crystal layer is grown on a single crystal semiconductor layer inside the doughnut-shaped opening 30 and a single crystal semiconductor layer is grown at the parts other than the single crystal layer, or a solid phase epitaxial growth technique for forming, after an amorphous semiconductor layer is formed, the amorphous semiconductor layer on a single crystal into a single crystal by performing low temperature heat treatment at approximately 600° C. for many hours.

By adopting these processes, a single crystal p-type silicon layer is deposited on the n⁻type silicon layer 23 which is a single crystal, and on the other hand, the outer peripheral side wall 31A and the inner peripheral side wall 31B composed of the second p-type polysilicon layer are formed on both wall surfaces of the doughnut-shaped opening 30.

Then, n-type impurities added selectively to the island-shaped portion of the first polysilicon layer 26 are introduced into the doughnut-shaped base region 32 through the inner peripheral side wall 31B composed of the second polysilicon layer, thereby to form a doughnut-shaped emitter region 33.

According to this method, the single crystal p-type silicon layer crystallized on the n⁻type silicon layer 23 is not required to be removed since it is separated by pn junction by the doughnut-shaped emitter region 33, thus making it possible to cut down the removal process thereof.

(2) Second embodiment

Figure 5A:
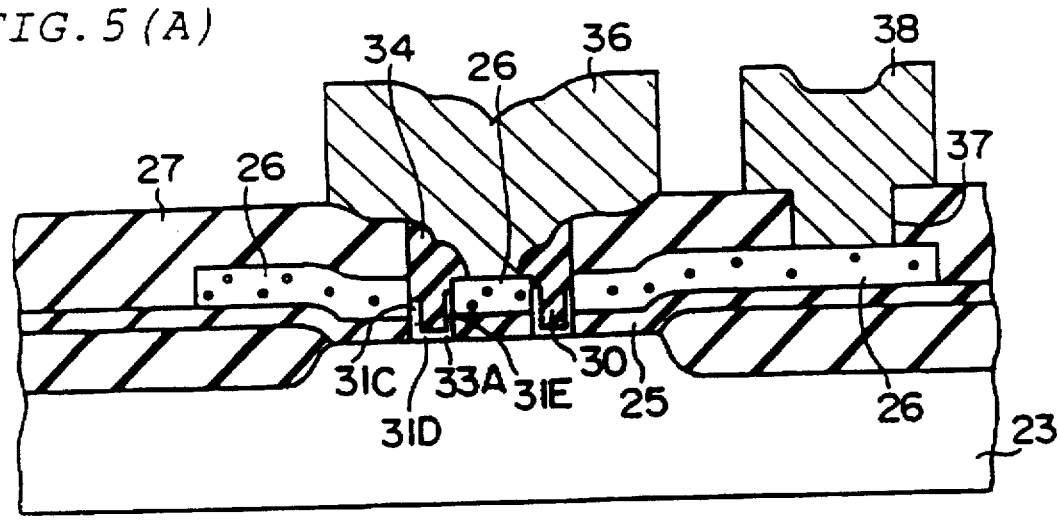
FIG. 5(A) is a sectional view showing a principal part of the bipolar transistor of the second embodiment of the present invention.
Figure 5B:
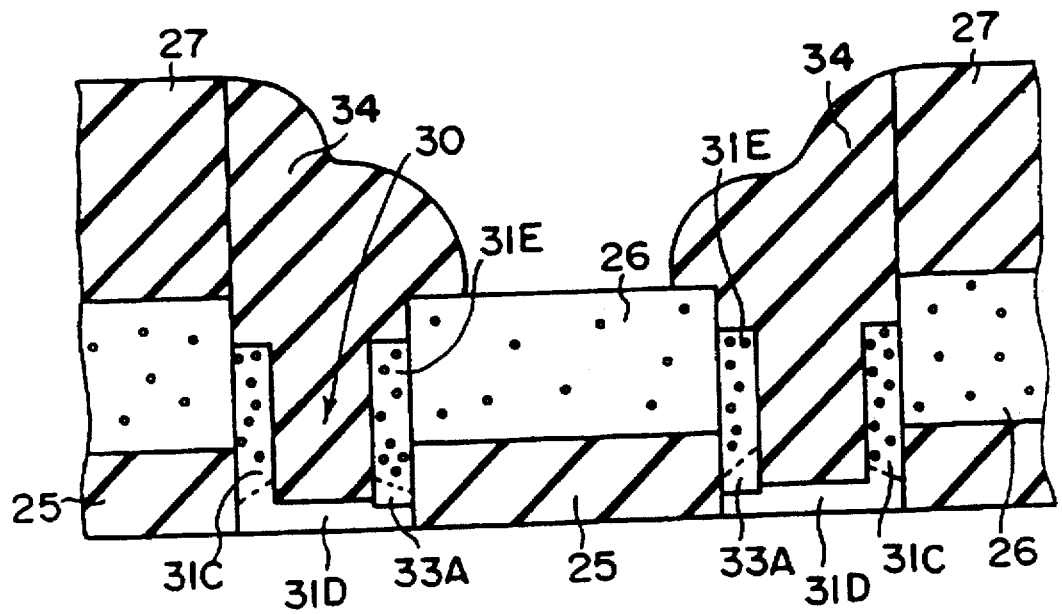
FIG. 5(B) and FIG. 5(C) are sectional views showing a part of the bipolar transistor.

FIG. 5(A) and FIG. 5(B) are explanatory views for explaining a structure of a bipolar transistor of a second embodiment.

FIG. 5(A) shows a section of a bipolar transistor of the second embodiment, and FIG. 5(B) shows an enlarged principal part thereof.

In these figures, the structure except an outer peripheral side wall 31C composed of a polysilicon layer, an inner peripheral side wall 31E composed of a polysilicon layer, and a doughnut-shaped base region 31D and emitter region 33A composed of a single crystal layer is the same as what has been described already.

In the present embodiment, as described already, the base region 31D is formed by using what is called an epitaxial polysilicon growth technique in which a single crystal layer is grown on the silicon layer 23 which is a single crystal semiconductor layer and a polycrystalline layer is grown at the portion other than the single crystal or a solid phase epitaxial growth technique for performing low temperature heat treatment at approximately 600° C. for many hours after forming an amorphous semiconductor layer on the whole surface, thereby to form the amorphous semiconductor layer on a single crystal into a single crystal.

In the bipolar transistor of the present embodiment, after a doughnut-shaped opening 30 is formed, a silicon layer containing p-type impurities is deposited in the doughnut-shaped opening 30, by using the above-described epitaxial polysilicon growth technique or solid phase epitaxial growth technique without forming the doughnut-shaped base region 32 in the n⁻type silicon layer 23 by introduction of p-type impurities in a similar manner as the first embodiment.

With this, the doughnut-shaped base region 31D composed of a single crystal layer of p-type silicon is deposited on the n⁻type silicon layer 23, and the outer peripheral side wall 31C and the inner peripheral side wall 31E composed of the second p-type polysilicon layer are formed on both wall surfaces of the doughnut-shaped opening 30.

Then, n-type impurities added selectively to an island-shaped polysilicon layer 26 located at the center of the doughnut-shaped opening 30 are introduced to a shallow depth into the doughnut-shaped base region 31D composed of a single crystal through the inner peripheral side wall 31E composed of the second polysilicon layer, thereby to form a doughnut-shaped emitter region 33A.

In the bipolar transistor of the present embodiment, not only similar effects to those of the first embodiment are produced, but also it is possible to form an inner base 31D, an outer peripheral side wall 31C composed of a polysilicon layer and an inner peripheral side wall 31E composed of a polysilicon layer at the same time by adopting a p-type epitaxial polysilicon technique or a solid phase epitaxial growth technique. Hence, the process is reduced.

Further, when a non-doping epitaxial growth technique is used, a process of forming a base region by introduction of impurities becomes necessary, but the process can be reduced because it is not required to remove polysilicon at the bottom.

Figure 5C:
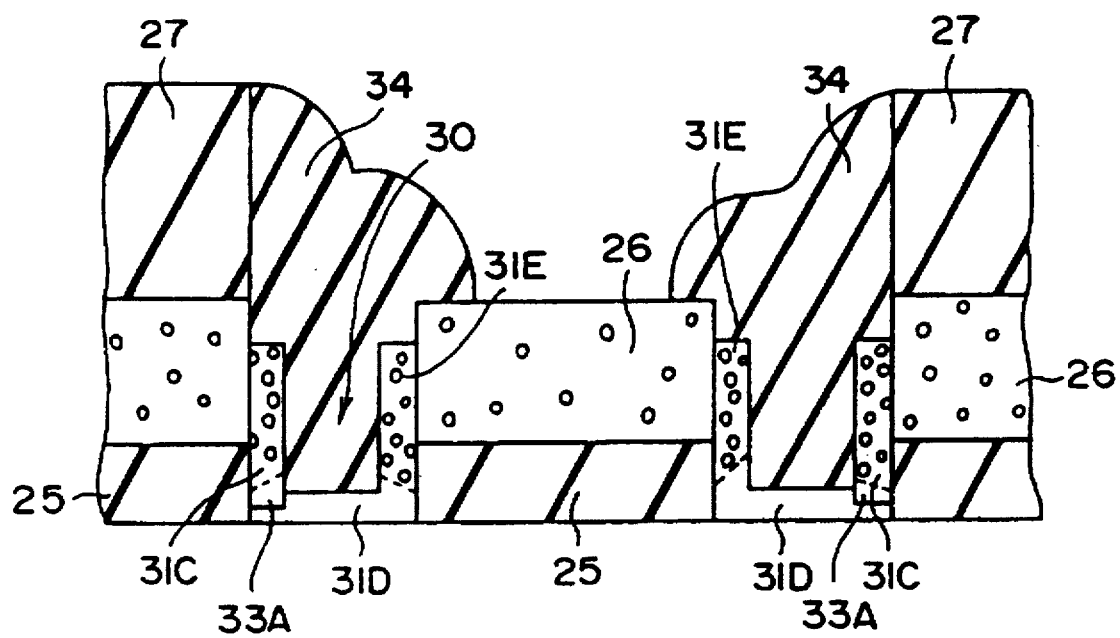

Besides, the emitter region 33A may be formed in the base region 31D under the outer peripheral side wall 31C as shown in FIG. 5(C). In this case, the polysilicon layer 26 located on the outside of the doughnut-shaped opening 30 is made to contain n-type impurities, and the p-type impurities are diffused in the base region 31D through the outer peripheral side wall 31C.

(3) Third embodiment

Figure 6:
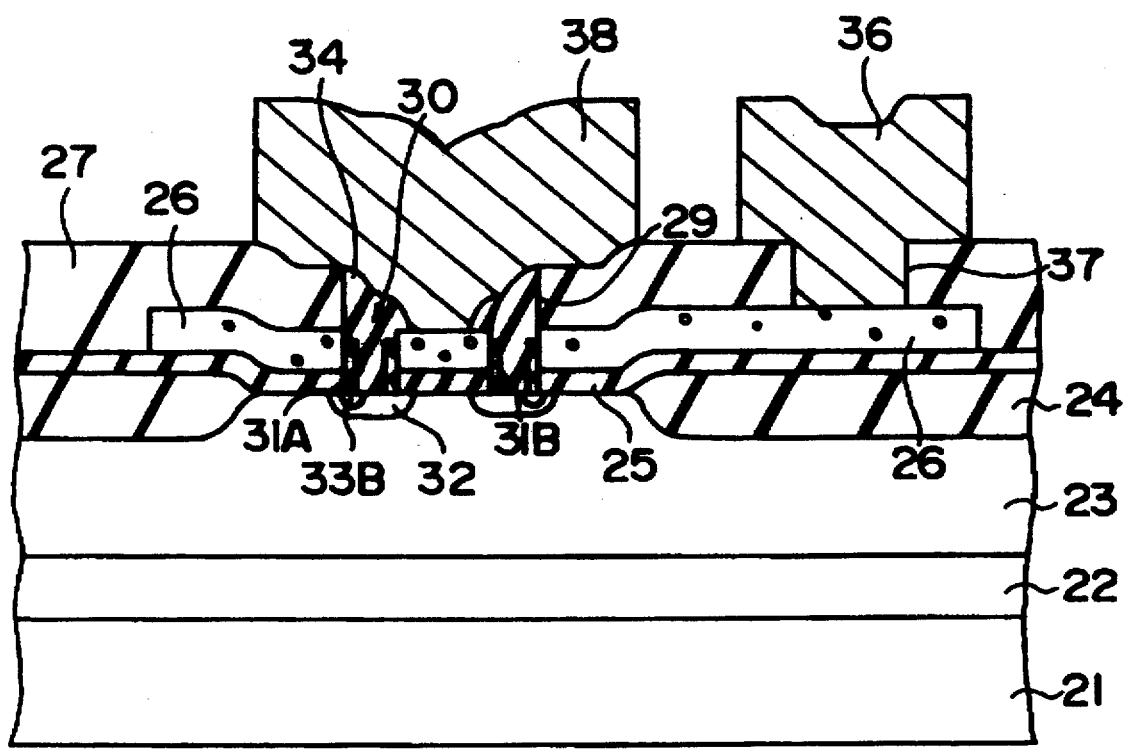
FIG. 6 is a sectional view showing a third embodiment of the present invention.

FIG. 6 is an explanatory view for explaining a structure of a bipolar transistor of a third embodiment.

Figure 3:
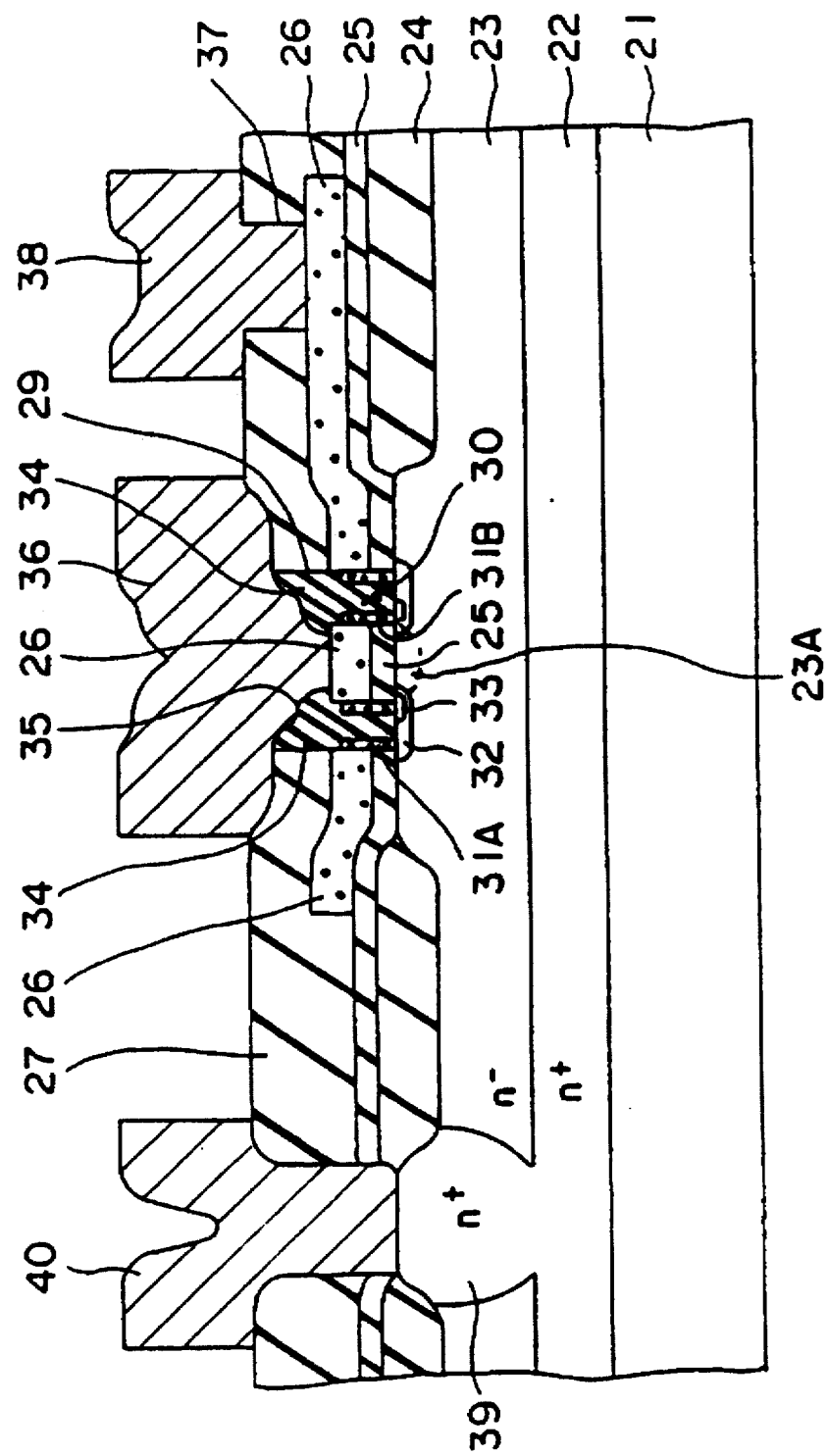
FIG. 3(A) is a sectional view showing a structure a bipolar transistor according to a first embodiment of the present invention.
FIG. 3(B) is a plan view showing a part of the bipolar transistor.
Figure 3:
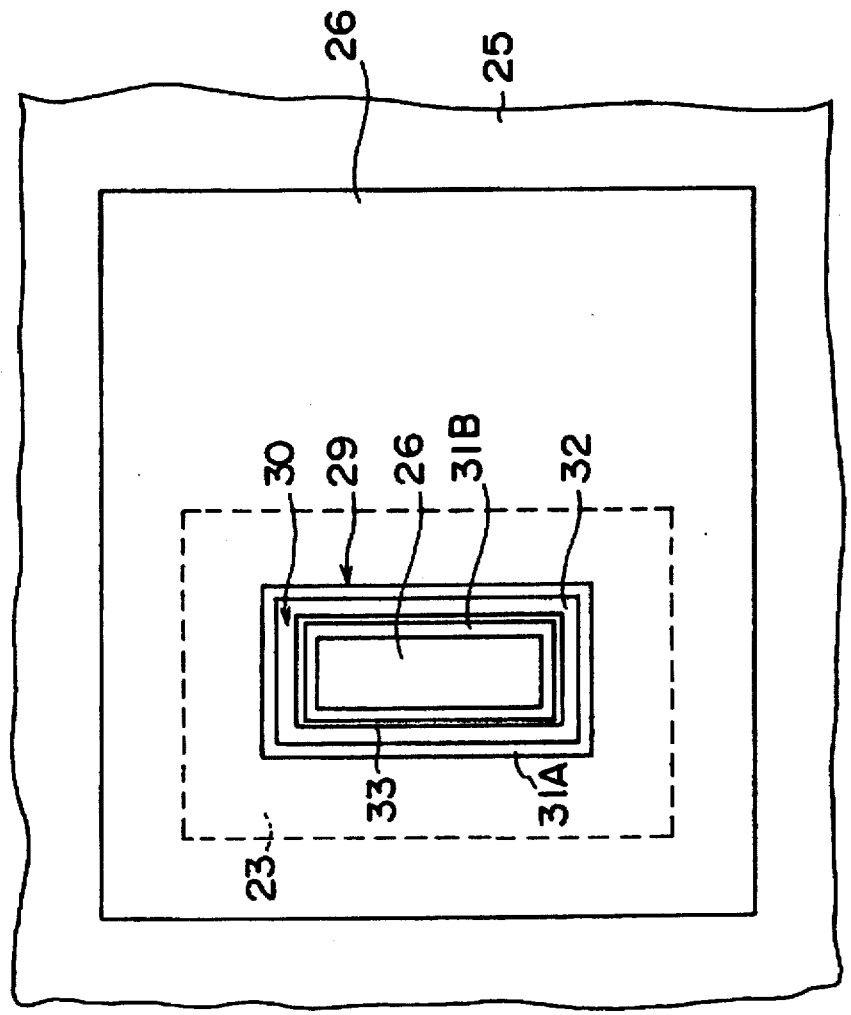

Reference numerals referred to in this figure have the same meaning as those explained in FIG. 3 by affixing the same reference numerals.

The bipolar transistor in the present embodiment is different from the bipolar transistor of the first embodiment in such points that an n-type doughnut-shaped emitter region 33B is formed at a portion where an outer peripheral side wall 31A comes into contact with an n⁻type silicon layer 23 among the outer peripheral side wall 31A and the inner peripheral side wall 31B composed of a second polysilicon layer formed at a doughnut-shaped opening 30, and that a base electrode is pulled out of doughnut-shaped base region 32 through an inner peripheral side wall 31B.

Similar effects to those of the first embodiment are obtainable according to the bipolar transistor of the present embodiment.

Further, in the above-described first embodiment and second embodiment, it is possible to invert pull-out positions of the emitter region and the collector region, and to form an integrated injection logic I²L with high integration without insulating mutually by combining such bipolar transistors in which the emitter region and the collector region are inverted.

(4) Fourth embodiment

FIGS. 7(A) to (J) are views for explaining the process of manufacturing a bipolar transistor which is a fourth embodiment.

In these figures, a reference numeral 23 represents an n⁻type silicon layer, 51 represents a Si₃N₄ layer, 24 represents a LOCOS oxide film, 25 represents a first SiO₂ layer, 26 represents a first polysilicon layer, 27 represents a second SiO₂ layer, 29 represents a first opening, 52 represents an Al side wall, 53 represents a second opening, 54 represents a first buried resist layer, 30 represents a doughnut-shaped opening, 31 represents a second polysilicon layer, 31A represents an outer peripheral side wall composed of the first polysilicon layer, 31B represents an inner peripheral side wall composed of the second polysilicon layer, 55 represents a second buried resist layer, 32 represents a doughnut-shaped base region, 34 represents a SiO₂ side wall, 35 represents a third opening, 33 represents a doughnut-shaped emitter region, 35 represents a fourth opening, 36 represents an emitter electrode and 38 represents a base electrode. It is to be understood that the semiconductor substrate 21, the buried layer 22, the n⁺diffused region 39 and the collector electrode 40 shown in FIGS. 3(A) and (B) are omitted in FIGS. 7(A) to 7(J).

A method of manufacturing a semiconductor device of the third embodiment will be described with reference to process explanatory views shown in FIGS. 7(A) to (J).

Figure 7A:
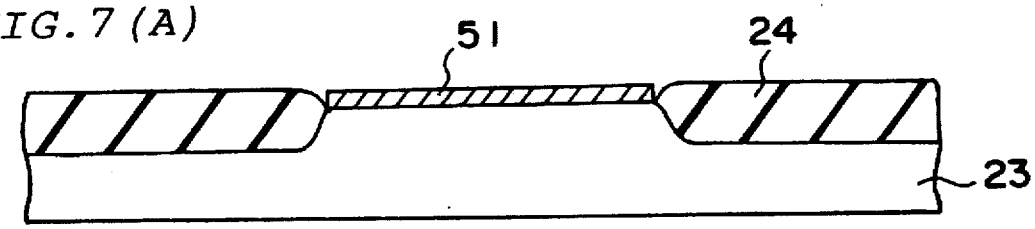
FIG. 7(A) to FIG. 7(J) are sectional views showing a principal part of a bipolar transistor in the manufacturing process of the present invention.

First, as a first process, the n⁺ buried layer 22 is formed on the semiconductor substrate 21, and the n⁻type silicon layer 23 is grown on layer 22 as shown in FIG. 3(A). Thereafter as shown in FIG. 7(A), a Si₃N₄ layer 51 is formed on the upper surface of the n⁻type silicon layer 23 by a CVD method. The Si₃N₄ layer 51 is left only in an element forming region by a photolithography technique, and the top surface of the silicon layer 23 is thermally oxidized with the Si₃N₄ layer 51 as a mask, thereby to form a LOCOS oxide film 24 composed of SiO₂ having a thickness of approximately 6,000 Å.

Besides, p-type impurities are introduced into a collector contact portion and annealing is applied thereto so as to form the n⁺type collector contact region 39 contacting the n⁺buried layer. The collector contact region 39 has such a sectional construction as shown in FIG. 3(A).

Figure 7B:
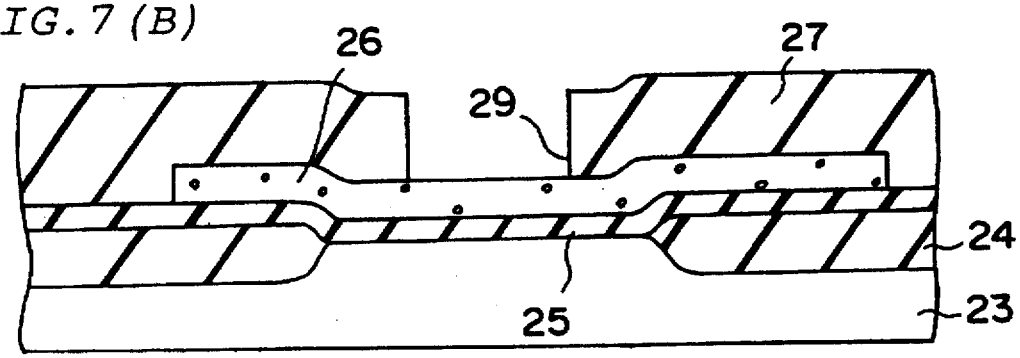

Next, a second process will be described with reference to FIG. 7(B).

After the Si₃N₄ layer 51 used as a mask is removed, a SiO₂ layer 25 having a thickness of approximately 2,500 Å is formed by a CVD method or thermal oxidization. A first polysilicon layer 26 doped with boron having a thickness of 2,500 Å is formed thereon by a CVD method. Furthermore, after a second SiO₂ layer 27 having a thickness of 5,000 Å is formed thereon by a CVD method, the first opening 29 is formed by a photolithography technique.

Figure 7C:
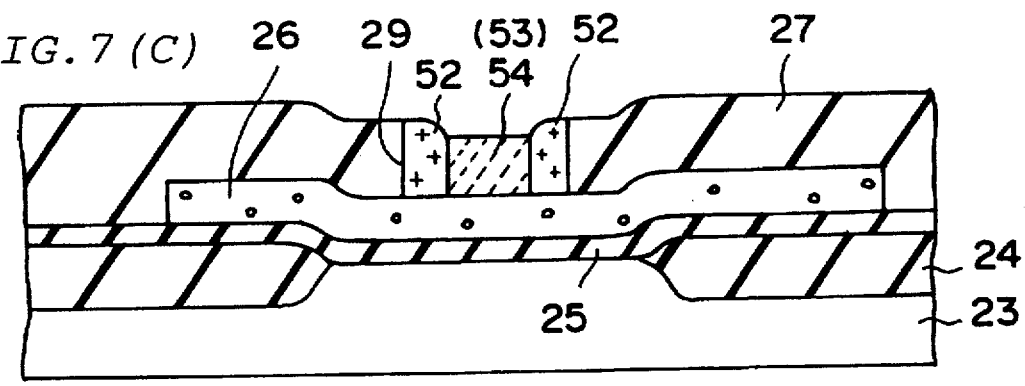

Next, a third process will be described with reference to FIG. 7(C).

An aluminum (Al) layer having a thickness of 2,000 Å is formed by deposition or sputtering on the whole surface including the first opening 29, and anisotropic etching is applied to the Al layer by a reaction ion etching (RIE) method, thereby to form an Al side wall 52 having a second opening 53 on the inner periphery of the first opening 29.

Figure 7D:
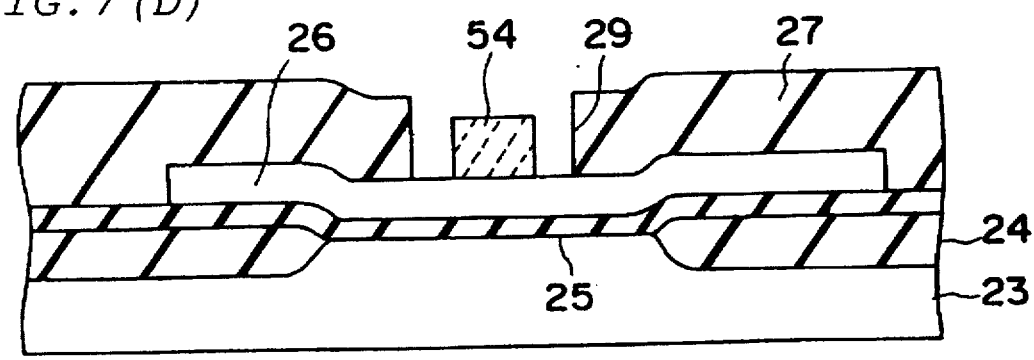

Besides, Al is used here as the material of the side wall 52, but any material other than Al such as a Si₃N₄ film, a polysilicon film and a PSG film which can be removed selectively with respect to the second SiO₂ layer 27 and the buried resist layer 10 in a process shown in FIG. 7(D) later may be adopted.

Then, after the resist layer is formed and etching is applied by an RIE method, a buried resist layer 54 is formed inside the second opening 53 of the Al side wall 52.

Next, a fourth process will be described with reference to FIG. 7(D).

The Al side wall 52 which has been formed on the inner periphery of the opening 29 of the second SiO₂ layer 27 is removed by etching, thus leaving the buried resist layer 54 in an island shape.

The material of the buried resist layer 54 is not limited to resist if it serves as a mask material in case the side wall 52 is removed and serves further as a mask material when the polysilicon layer 26 and the first SiO₂ layer 25 are etched and is able to be removed selectively without etching the second SiO₂ layer 6 and the first SiO₂ layer 4. A Si₃N₄ film, a polysilicon film, a PSG film or the like may also be used.

Figure 7E:
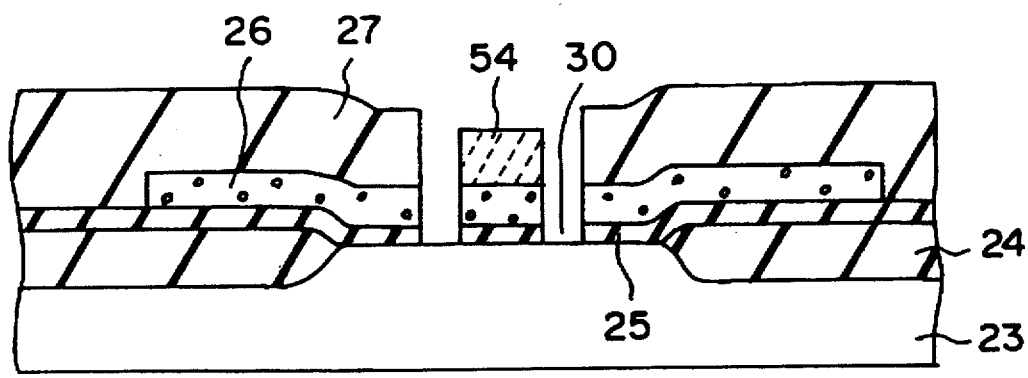

Next, a fifth process will be described with reference to FIG. 7(E).

The first boron-doped polysilicon layer 26 and the first SiO₂ layer 25 are removed by dry etching or wet etching using the second SiO₂ layer 27 and the buried resist layer 54 as a mask, thereby to form the doughnut-shaped opening 30 exposing the top surface of the n⁻type silicon layer 23.

Besides, the "doughnut shape" of this doughnut-shaped opening 30 not only means that the plane configuration is a round shape, but also shall include a closed loop configuration (a ring shape) which is a rectangle or a square in many cases.

Figure 7F:
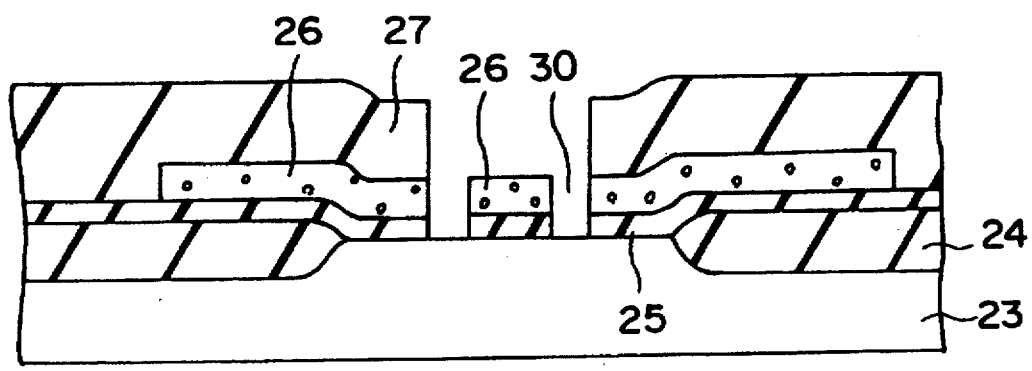

Next, a sixth process will be described with reference to FIG. 7(F).

After the above-described process is completed, the first buried resist layer 54 used as a mask when the doughnut-shaped opening 30 is formed is removed.

Figure 7G:
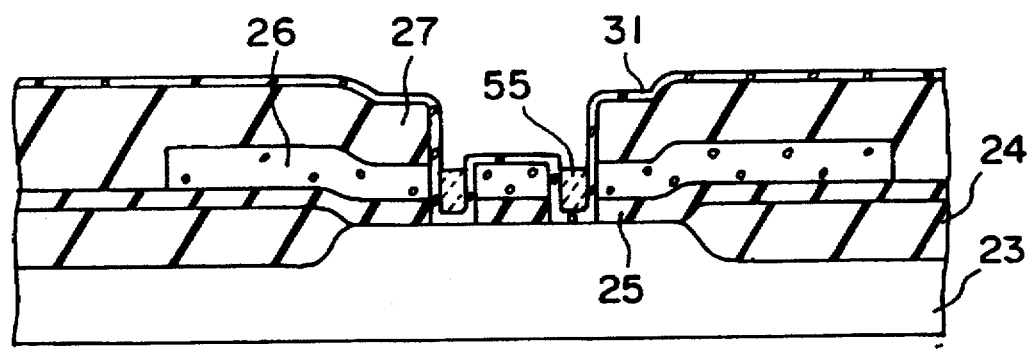

Next, a seventh process will be described with reference to FIG. 7(G).

A second polysilicon layer 31 having a thickness of approximately 200 to 500 Å is formed on the whole surface along the inner surface of the doughnut-shaped opening 30 and the top surfaces of the silicon layer 23 and the SiO₂ film 27. Thereafter, resist is applied to the whole surface and anisotropic etching is applied to the resist in an almost perpendicular direction by an RIE method, thereby to form a second buried resist layer 55 in the doughnut-shaped opening 30.

Figure 7H:
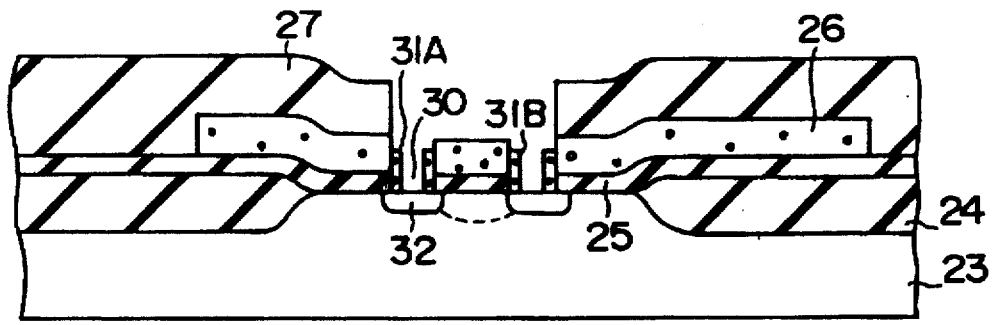

Next, an eighth process will be described with reference to FIG. 7(H).

First, the second polysilicon layer 31 which is not covered by the second buried resist layer 55 is removed by an RIE method, a wet etching method or the like.

Thereafter, the second buried resist layer 55 is removed by an RIE method, and a portion laminated on the bottom of the doughnut-shaped opening 30 in the second polysilicon layer 31 is removed selectively thereafter by anisotropic etching. With this, the outer peripheral side wall 31A and the inner peripheral side wall 31B composed of the second polysilicon layer 31 are formed separately.

Then, a doughnut-shaped base region 32 is formed by ion implantation of p-type impurities into the n⁻type silicon layer 26 through the doughnut-shaped opening 30.

Besides, introduction of p-type impurities may be performed prior to forming the outer peripheral side wall 31A and the inner peripheral side wall 31B.

Next, a ninth process will be described with reference to FIG. 7(I).

A SiO₂ layer having a thickness of approximately 3,000 Å is deposited on the whole top surface by a low pressure CVD method, and etching is applied thereto in an almost perpendicular direction by an RIE method, thereby to form a second side wall 34 composed of SiO₂ having a third opening 35 at a central part thereof.

Arsenic ions (As⁺) which are n-type impurities are implanted at accelerating energy of 40 KeV and in a dose of approximately $2 \times 10^{16}$ cm² through the third opening 35 of the second side wall 34 composed of SiO² into the first polysilicon layer 26 thereunder.

Besides, a base region of low concentration may also be formed in the doughnut-shaped base region 32 by implanting B⁺ ions through the opening 35 so as to form the n⁻type silicon layer 23 under the first SiO² layer 25 immediately under the opening 35 into a p-type of low concentration. By doing so, it is possible to prevent leakage between the base and the emitter, and moreover, to cause no increase of the parasitic capacity because of low concentration, thus achieving operation at a high speed.

Next, a tenth process will be described with reference to FIG. 7(J).

An opening 37 is formed in a second SiO² layer 27 on the first polysilicon layer 26 in a region near by the doughnut-shaped opening 30. With this, the opening 37 is connected to the doughnut-shaped base region 32 through the first polysilicon layer 26 and the outer peripheral side wall 31A.

Thereafter, an Al layer is formed on the whole surface by a deposition or sputtering method, and an emitter electrode 36 and a base electrode 38 are formed by patterning the Al layer. Further, as shown in FIG. 3(A), a collector electrode 40 is formed in the collector region of the n+ type Si layer 1.

Figure 7I:
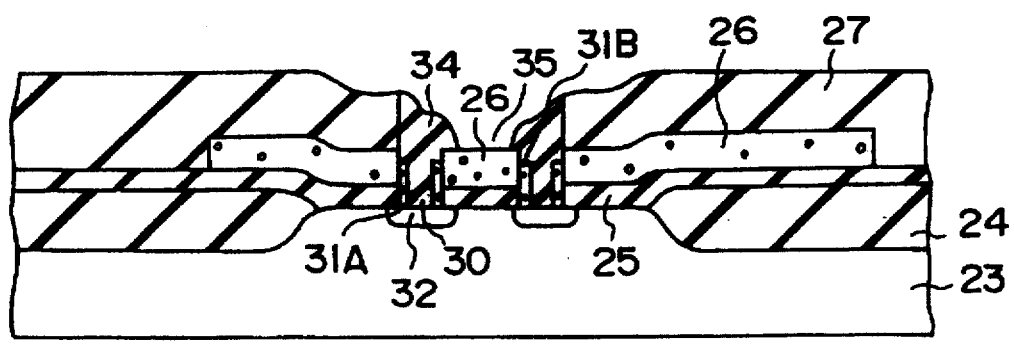
Figure 7J:
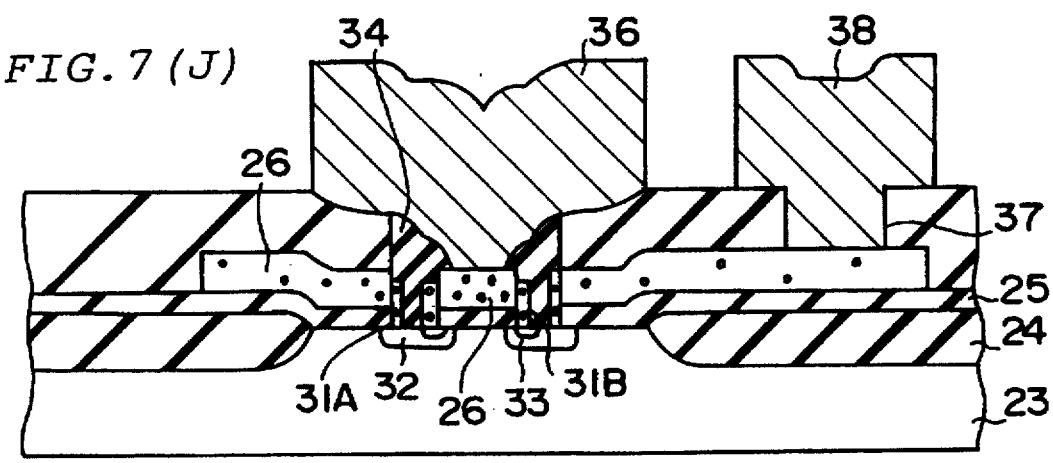

Besides, in the ninth process (see FIG. 7(I)), As ions which are n-type impurities implanted into the first polysilicon layer 26 through the third opening 35 of the side wall 34 composed of SiO₂ are diffused into the surface of the doughnut-shaped base region 32 through the inner peripheral side wall 31B composed of polysilicon contacting thereto by means of heat treatment applied after this process, thus forming a doughnut-shaped emitter region 33.

Further, boron ions in the polysilicon layer 26 are diffused into the surface of the doughnut-shaped base region 32 through the outer peripheral side wall 31A composed of polysilicon contacting thereto, which ensures electrical contact with the base electrode 38.

According to the method of manufacturing a bipolar transistor in the present embodiment, operational effects are obtainable as follows.

1. Using the inner wall of a large first opening formed in the insulating film as the reference, a small ring-shaped opening is formed therein without using a lithography technique, and the base region is formed using the ring-shaped opening. Thus, it is possible to form a very small base region exceeding the lithography technique. As a result, it is possible to reduce the parasitic capacity between the base and the collector.

2. Since the width of the ring-shaped emitter is determined by the width of the side wall of the polysilicon layer containing impurities, an ultra-fine emitter region is formed, and the parasitic capacity between the base region and the emitter region is reduced. 3. Since a second opening communicating with the emitter region is formed in a self-alignment manner using the side wall insulating film of the first opening without performing mask alignment a plurality of times as in a prior art, it is possible to form a fine opening easily without requiring high positioning accuracy.

Besides, when the ring-shaped opening 30 is formed, the lithography technique may be used without using the Al side wall. Although mask alignment is required in this case, reduction of the parasitic capacity between the base and the collector and reduction of the parasitic capacity between the base and the emitter can be achieved.

Besides, when the emitter region such as shown in the third embodiment (see FIG. 5(A)) is formed immediately under the outer peripheral side wall, n-type impurities such as phosphorus (P) and arsenic (As) shall be the impurities contained in the first polysilicon layer 26 on the outer periphery of the doughnut-shaped opening 30. Further, p-type impurities are contained in the island-shaped polysilicon layer 26 surrounded by the doughnut-shaped opening 30, and the inner peripheral side wall is used as a pull-out electrode.

(5) Other embodiments

The first SiO₂ layer 25, the second SiO₂ layer 27 and the SiO₂ side wall 34 are not required to be of SiO₂, but may be insulating layers such as Si₃N₄.

Further, it is also possible to use other conductive materials such as silicide such as $W_xSi_y$ and $Ti_xSi_y$ having lower resistance and polycide or silicide having lower resistance and polycide or silicide which is a composite film of polysilicon and silicide in place of the first polysilicon layer 26.

Furthermore, the outer peripheral side wall 31A and the inner peripheral side wall 31B composed of polysilicon may be formed of a conductor such as $W_xSi_y$ and $Ti_xSi_y$ in which impurities are movable.

The base region is formed into a p-type and the emitter region and the collector region are formed into an n-type in the above-mentioned embodiments, but these conductive types may be reversed.

Further, the semiconductor layer on the buried layer is used as a collector region and the doughnut-shaped emitter region is formed in the base region in the above-mentioned embodiments, but, on the contrary, the semiconductor layer may be used as the emitter and the doughnut-shaped collector may be formed in the base region formed in the upper layer thereof.

What is claimed is:

1. A bipolar transistor comprising:

a semiconductor layer of a first conduction type;

a ring-shaped base region having a second conduction type which is opposite to said first conduction type formed in said semiconductor layer, said ring-shaped base region having inner and outer peripheries, said semiconductor layer including a collector region disposed adjacent said ring-shaped base region;

a base pull-out electrode connected electrically to a portion of said ring-shaped base region that is disposed between said inner and outer peripheries thereof;

a ring-shaped emitter region of the first conduction type formed in said ring-shaped base region at a position located between said portion of the ring-shaped base region and said inner periphery thereof;

an emitter pull-out electrode connected electrically to said ring-shaped emitter region; and a field plate structure including a field plate and a thin insulating film, said thin insulating film contacting said ring-shaped base region at a location within said ring-shaped emitter region, said field plate being separated from said base region by said thin insulating film and having the same potential as said ring-shaped emitter region.

2. A bipolar transistor according to claim 1, wherein said field plate structure is formed on an area of said semiconductor layer surrounded by said ring-shaped base region, and wherein said area of said semiconductor layer comprises a second conduction type region of lower concentration than said second conduction type ring-shaped base region.

3. A bipolar transistor comprising:

a semiconductor layer of a first conduction type;

a ring-shaped base region having a second conduction type which is opposite to said first conduction type formed in said semiconductor layer, said ring-shaped base region having inner and outer peripheries, said semiconductor layer including a collector region disposed adjacent said ring-shaped base region;

a ring-shaped emitter region of the first conduction type formed on said ring-shaped base region at a position located between said inner and outer peripheries thereof;

an emitter pull-out electrode connected electrically to said ring-shaped emitter region;

a base pull-out electrode connected electrically to a portion of said ring-shaped base region disposed between said ring-shaped shaped emitter region and the outer inner periphery of said ring-shaped base region; and a conductive film structure including a conductive film and an insulating film, said base pull-out electrode being connected to said conductive film through said insulating film, said conductive film structure being formed on an area of said semiconductor layer surrounded by said ring-shaped base region.

* * * * *

UNITED STATES PATENT AND TRADEMARK OFFICE
CERTIFICATE OF CORRECTION

PATENT NO. : 5,712,505
DATED : January 27, 1998
INVENTOR(S) : Shunji NAKAMURA

It is certified that error appears in the above-indentified patent and that said Letters Patent is hereby corrected as shown below:

<u>Column 3</u>

Line 62, "b" should be --<u>b</u>--.

Line 64, "a" should be --<u>a</u>--.

<u>Column 7</u>

Line 62, "represent" should be --represents--.

<u>Column 10</u>

Line 3, "3unction" should be --junction--.

<u>Column 11</u>

Line 48, "35" should be --37--.

<u>Column 13</u>

Line 58, "n+type" should be --n-type--.

Signed and Sealed this

Second Day of June, 1998

*Attest:*

BRUCE LEHMAN

*Attesting Officer*  *Commissioner of Patents and Trademarks*